(12) United States Patent
Gupta et al.

(10) Patent No.: US 9,318,642 B2
(45) Date of Patent: Apr. 19, 2016

(54) METHOD AND APPARATUS PROVIDING SINGLE STEP VAPOR CHLORIDE TREATMENT AND PHOTOVOLTAIC MODULES

(71) Applicant: FIRST SOLAR, INC., Perrysburg, OH (US)

(72) Inventors: Akhlesh Gupta, Sylvania, OH (US); Markus Gloeckler, Perrysburg, OH (US); Ricky C. Powell, Ann Arbor, MI (US)

(73) Assignee: FIRST SOLAR, INC., Perrysburg, OH (US)

( * ) Notice: Subject to any disclaimer, the term of this patent is extended or adjusted under 35 U.S.C. 154(b) by 0 days.

(21) Appl. No.: 13/678,800

(22) Filed: Nov. 16, 2012

(65) Prior Publication Data
US 2013/0130433 A1    May 23, 2013

Related U.S. Application Data

(60) Provisional application No. 61/561,375, filed on Nov. 18, 2011.

(51) Int. Cl.
| | |
|---|---|
| H01L 31/18 | (2006.01) |
| C23C 14/12 | (2006.01) |
| C23C 14/56 | (2006.01) |
| C23C 14/06 | (2006.01) |
| C23C 14/24 | (2006.01) |
| H01L 21/02 | (2006.01) |

(Continued)

(52) U.S. Cl.
CPC ........ *H01L 31/1828* (2013.01); *C23C 14/0629* (2013.01); *C23C 14/24* (2013.01); *C23C 14/56* (2013.01); *H01L 21/02562* (2013.01); *H01L 21/02664* (2013.01); *H01L 31/1864* (2013.01); *H01L 31/073* (2013.01); *Y02E 10/543* (2013.01); *Y02P 70/521* (2015.11)

(58) Field of Classification Search
CPC ............ H01L 31/073; H01L 31/03925; H01L 31/0296
USPC ......................................................... 438/95
See application file for complete search history.

(56) References Cited

U.S. PATENT DOCUMENTS 6,251,701 B1 * 6/2001 McCandless .................... 438/95
6,423,565 B1 * 7/2002 Barth et al. ...................... 438/57

(Continued)

FOREIGN PATENT DOCUMENTS

EP            2 333 844 A2    6/2011
WO    WO 2011/133361 A1    10/2011

OTHER PUBLICATIONS

Zhou, T.X.; Reiter, N.; Powell, R.C.; Sasala, R.; Meyers, P.V., "Vapor chloride treatment of polycrystalline CdTe/CdS films," Photovoltaic Energy Conversion, 1994., Conference Record of the Twenty Fourth. IEEE Photovoltaic Specialists Conference—1994, 1994 IEEE First World Conference on , vol. 1, no., pp. 103,106 vol. 1, Dec. 5-9, 1994.*

(Continued)

*Primary Examiner* — Victor A Mandala
*Assistant Examiner* — Regan J Rundio
(74) *Attorney, Agent, or Firm* — Blank Rome LLP

(57) ABSTRACT

A method and apparatus are disclosed in which cadmium chloride is deposited on a cadmium telluride layer while simultaneously heat treating the cadmium telluride layer.

13 Claims, 4 Drawing Sheets

(51) Int. Cl.
*H01L 31/0296* (2006.01)
*H01L 31/073* (2012.01)

(56) References Cited

U.S. PATENT DOCUMENTS

| | | | |
|---|---|---|---|
| 6,537,845 | B1 | 3/2003 | McCandless et al. |
| 7,910,166 | B2 | 3/2011 | Powell et al. |
| 7,939,363 | B1 | 5/2011 | Johnson et al. |
| 2004/0182855 | A1* | 9/2004 | Centanni .................. 219/628 |
| 2007/0283885 | A1* | 12/2007 | Hattendorf ................ 118/716 |
| 2009/0035465 | A1* | 2/2009 | Marsh et al. ............ 427/255.28 |
| 2010/0059112 | A1 | 3/2010 | Gupta et al. |
| 2010/0200063 | A1* | 8/2010 | Djeu ........................ 136/259 |
| 2010/0304575 | A1* | 12/2010 | Keim et al. ................ 438/796 |
| 2011/0005594 | A1 | 1/2011 | Powell et al. |
| 2011/0088768 | A1 | 4/2011 | Gloeckler et al. |
| 2011/0240123 | A1* | 10/2011 | Lin et al. .................. 136/260 |

OTHER PUBLICATIONS

J Kokaj and A E Rakhshani. "Photocurrent spectroscopy of solution-grown CdS films annealed in CdCI2 vapour," 2004 J. Phys. D: Appl. Phys. 37 1970.*

B. E. McCandless et al., "Processing Options for CdTe Thin Film Solar Cells," Solar Energy, vol. 77, pp. 839-856, 2004.

V. Barrioz et al., "In Situ Deposition of Cadmium Chloride Films Using MOCVD for CdTe Solar Cells," Thin Solid Films, vol. 515, pp. 5808-5813, 2007.

* cited by examiner

METHOD AND APPARATUS PROVIDING SINGLE STEP VAPOR CHLORIDE TREATMENT AND PHOTOVOLTAIC MODULES

CLAIM OF PRIORITY

This application claims priority under 35 U.S.C. §119(e) to U.S. Provisional Patent Application Ser. No. 61/561,375 filed on Nov. 18, 2011, which is hereby incorporated by reference in its entirety herein.

FIELD OF THE INVENTION

Disclosed embodiments relate to the manufacture of photovoltaic modules, and more particularly to methods of performing cadmium chloride treatment of photovoltaic modules including cadmium telluride.

BACKGROUND OF THE INVENTION

Photovoltaic devices can include semiconductor material deposited over a substrate, for example, with a first layer serving as a window layer and a second layer serving as an absorber layer. The semiconductor window layer can allow the penetration of solar radiation to the absorber layer, such as a cadmium telluride layer, which converts solar energy to electricity. Photovoltaic devices can also contain one or more transparent conductive oxide layers, which are also often conductors of electrical charge.

Processing of photovoltaic cells can include heat treatment of cadmium telluride coated plates with cadmium chloride, which can improve crystalline quality and transport properties in cadmium telluride. In conventional multi-step methods of cadmium chloride treatments, cadmium chloride is applied to a cadmium telluride coated plate in a first step by a technique such as solution spraying, dipping the plate into solution, vapor application, or atomized mist application. The cadmium chloride is then activated by heat treatment in a second step.

However, the various known multi-step methods include several drawbacks including a lack of control over humidity, which could facilitate formation of cadmium telluride-chlorates, and longer processing times due to the multi-step process. Accordingly, a simplified process for cadmium chloride treatment is desired.

DETAILED DESCRIPTION OF THE INVENTION

A method of manufacturing a photovoltaic device may include introducing cadmium chloride vapors to an oven to deposit cadmium chloride on a cadmium telluride layer while maintaining the oven at a temperature suitable for simultaneously heat-treating the deposited cadmium chloride. In one disclosed embodiment, application of the cadmium chloride and heat treatment are combined into a single step on moving plates.

Figure 1:
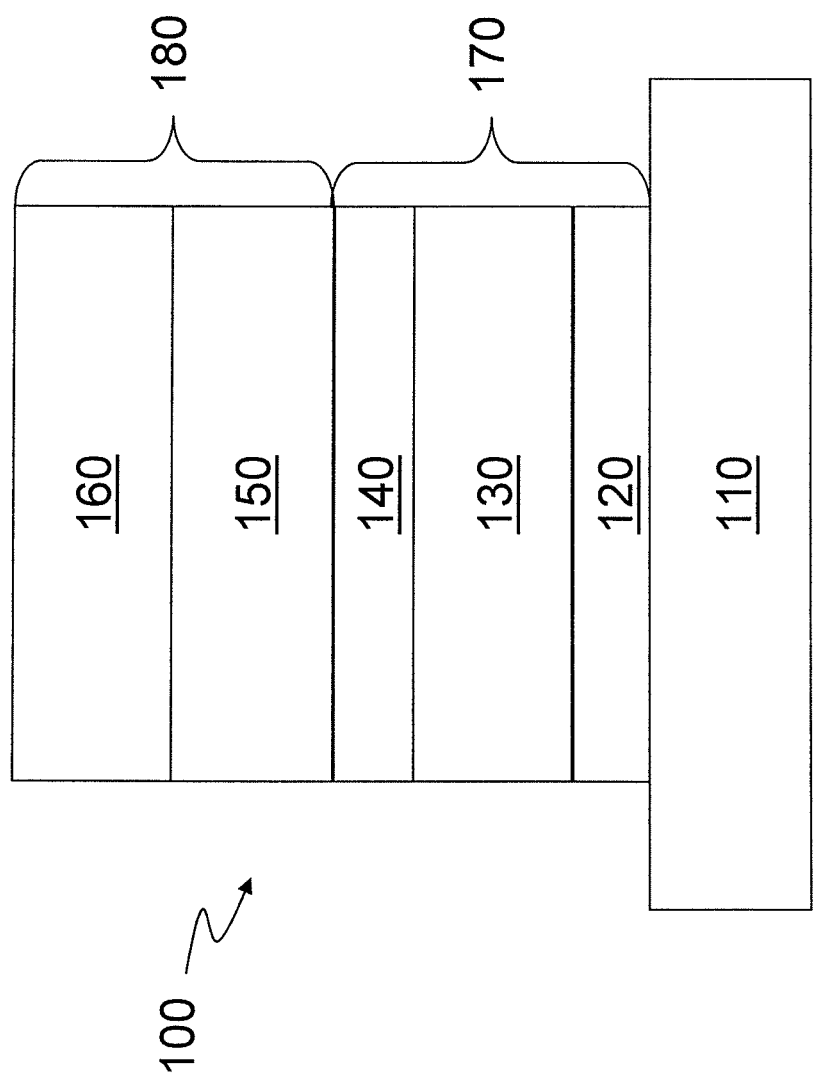
FIG. 1 is a schematic of a photovoltaic device having multiple layers.

As shown in FIG. 1, a photovoltaic device 100 can include a transparent conductive oxide stack 170 adjacent to a substrate 110 and layers of semiconductor material 180.

The substrate layer 110 can be the outermost layer of the device 100 and, in use, may be exposed to a variety of temperatures and forms of precipitation, such as rain, snow, sleet, and hail. The substrate layer 110 may also be the first layer that incident light encounters upon reaching the device 100. It is therefore desirable to select a material for the substrate layer 110 that is both durable and highly transparent. For these reasons, the substrate layer 110 may include, for example, borosilicate glass, soda lime glass, or float glass.

The transparent conductive oxide stack 170 may be formed adjacent to the substrate layer 110 and may include a plurality of layers. For example, the transparent conductive oxide stack 170 may include a barrier layer 120 adjacent to the substrate layer 110, a transparent conductive oxide layer 130 adjacent to the barrier layer 120, and a buffer layer 140 adjacent to the transparent conductive oxide layer 130. The transparent conductive oxide stack 170 may be formed through a series of manufacturing steps where each successive layer is formed adjacent to a previous layer on the device 100.

The layers of semiconductor material 180 can include a bi-layer, which may include an n-type semiconductor window layer, for example, a cadmium sulfide layer 150 or, more specifically, a cadmium zinc sulfide layer, and a p-type semiconductor absorber layer, for example, a cadmium telluride layer 160. The cadmium sulfide layer 150 and the cadmium telluride layer 160 may be positioned in contact with one another to create an electric field. Photons can free electron-hole pairs upon making contact with the cadmium sulfide layer, sending electrons to the n side and holes to the p side. Electrons can flow back to the p side via an external current path. The resulting electron flow provides current, which combined with the resulting voltage from the electric field, creates power. The result is the conversion of photon energy into electric power.

Cadmium zinc sulfide may be used as the material in the cadmium sulfide layer 150. Cadmium zinc sulfide has proven more robust than cadmium sulfide for its ability to withstand high anneal temperatures during cadmium chloride annealing of the absorber layer. The cadmium zinc sulfide may be deposited using any suitable technique, including any of those described in U.S. patent application Ser. No. 12/833,960 filed on Jul. 10, 2010, which is hereby incorporated by reference in its entirety. The cadmium telluride layer 160 can be deposited on the cadmium sulfide layer 150 using any suitable means, including vapor transport deposition.

Figure 2:
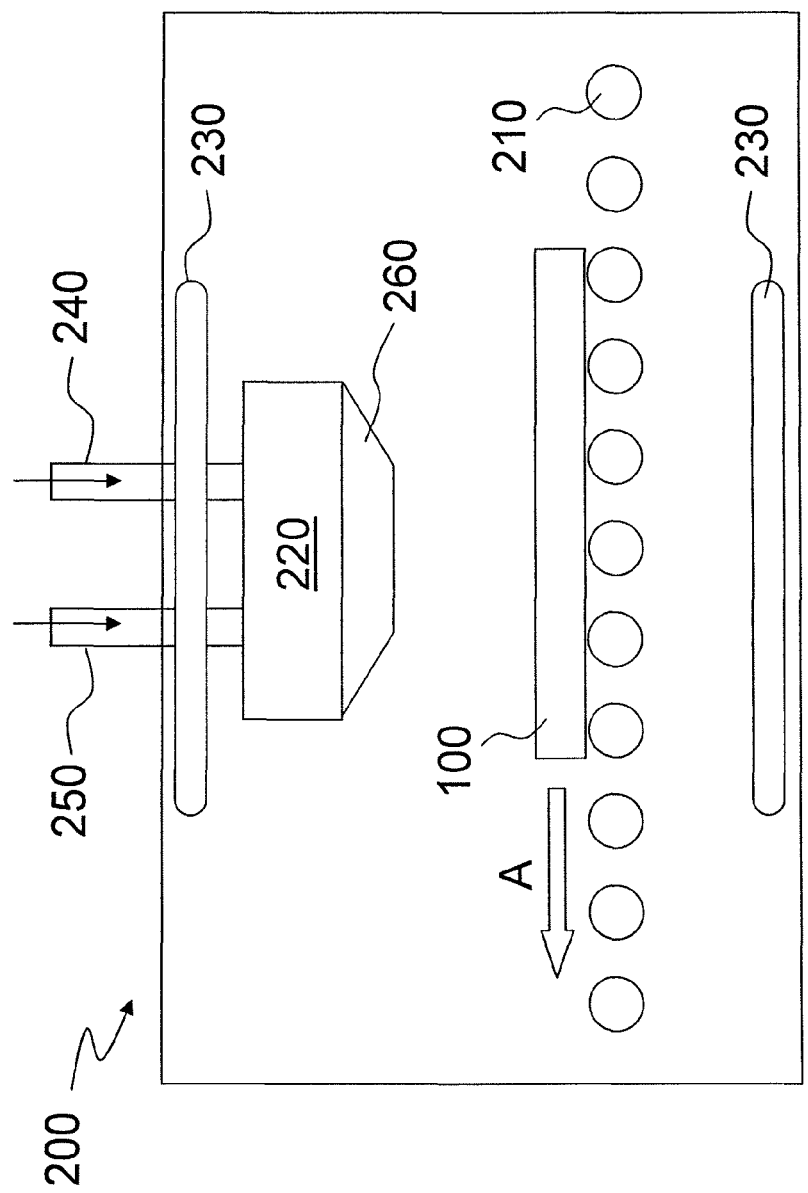
FIG. 2 is a schematic of a vapor deposition oven according to an embodiment described herein.

Following deposition, the cadmium telluride layer 160 may undergo a single step vapor cadmium chloride treatment, thereby increasing grain size and improving device 100 efficiency. Referring to FIG. 2, by way of example, a device 100 is transported through an oven 200 on a transport mechanism, for example rollers 210 in a continuous process. In various embodiments, the transport mechanism may be rollers, a belt, or other conveying means. The oven 200 may include a plurality of heaters 230 to maintain the temperature of the device 100 at a desired temperature for the vapor cadmium chloride treatment.

The oven 200 of the embodiment shown in FIG. 2 includes an in-situ vaporization unit 220 to vaporize the cadmium chloride inside the oven 200. Cadmium chloride may be provided to the vaporization unit 220 through a cadmium chloride input line 250, for example, in powder form. A carrier gas may optionally be supplied to the vaporization unit 220 through an optional carrier gas input line 240 to distribute the vaporized cadmium chloride. The carrier gas used can be hydrogen, helium, nitrogen, neon, argon, krypton, and mixtures containing these gasses. Alternatively, the carrier gas may be omitted and the cadmium chloride vapor may diffuse under ambient conditions.

Cadmium chloride vapors are introduced through a diffuser 260 in an amount and at an appropriate location over the moving device 100 to deposit a desired amount of cadmium chloride onto the cadmium telluride. An apparatus and method for depositing a vaporizable semiconductor material as a film on a glass substrate is described, for example, in U.S. Pat. No. 7,910,166, the disclosure of which is herein incorporated by reference in its entirety. In one embodiment, the process may be continuous and may include transporting the device 100 through the oven 200 at the same time as depositing the cadmium chloride and heat treating the cadmium telluride layer 160.

Figure 3:
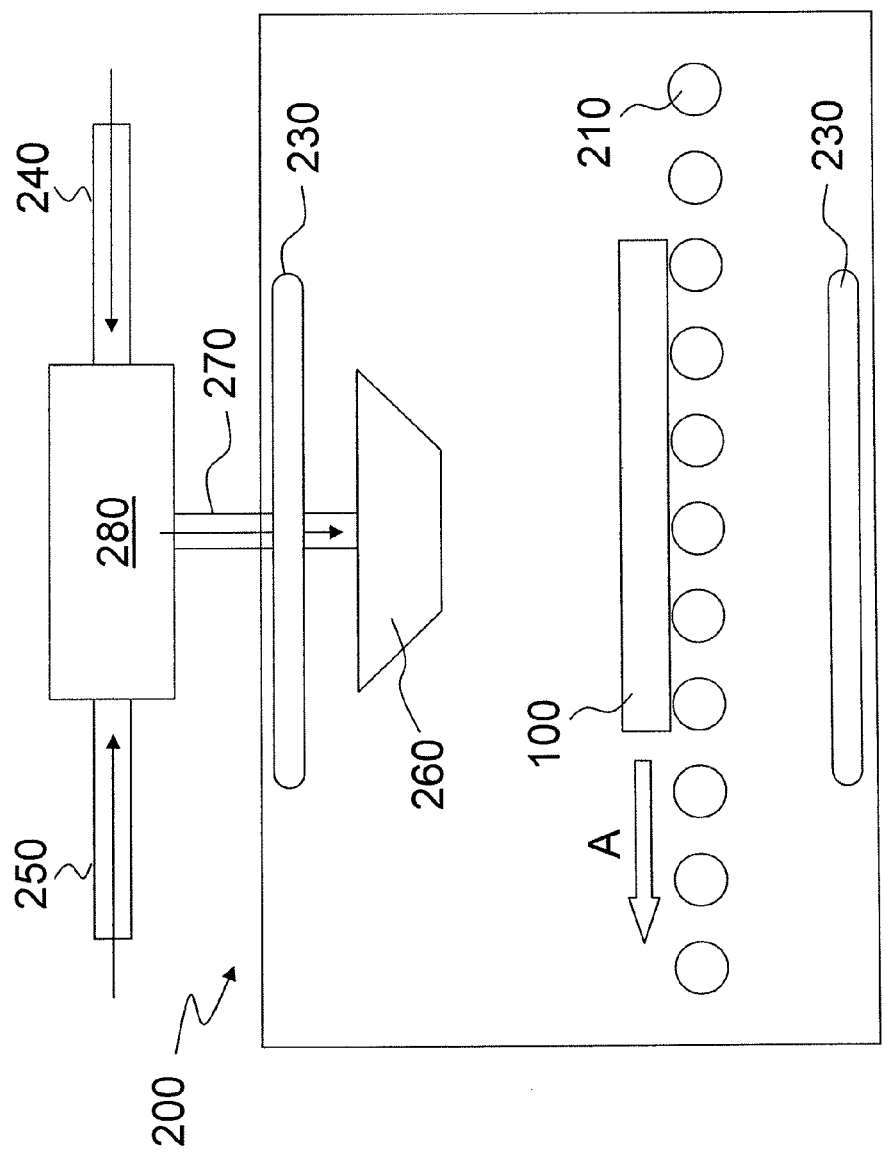
FIG. 3 is a is a schematic of a vapor deposition oven according to another embodiment described herein.

Referring to FIG. 3, by way of another example, an oven 200 includes an ex-situ vaporization unit 280 to vaporize the cadmium chloride outside the oven 200. The vaporized cadmium chloride may then be injected into the oven 200 through a vaporized cadmium chloride input line 270 and a diffuser 260. Cadmium chloride may be provided to the vaporization unit 280 through a cadmium chloride input line 250, for example, in powder form. A carrier gas may optionally be supplied to the vaporization unit 280 through an optional carrier gas input line 240 to distribute the vaporized cadmium chloride. Alternatively, the carrier gas may be omitted and the cadmium chloride vapor may diffuse through the vaporized cadmium chloride input line 270 under ambient conditions. Cadmium chloride vapors are introduced through a diffuser 260 in an amount and at an appropriate location over the moving device 100 to deposit a desired amount of cadmium chloride onto the cadmium telluride.

The ex-situ vaporization unit 280 provides good control over the source temperature and the vapor amount of the cadmium chloride vapor, for example, through the use of a throttle valve to regulate carrier gas flow. Use of the ex-situ vaporization unit 280 also allows for distribution of the vaporized cadmium chloride to be controlled by the use of a manifold, which improves efficiency. The ex-situ vaporization unit 280 also allows for independent control of the source temperature of the cadmium chloride vapor and the temperature within the treatment oven 200 and specifically allows for the operation of the vaporization unit 280 at a much higher temperature than the oven 200 and the device 100. This, in turn, allows for better control of the heat treatment process. In one embodiment, the source temperature of the cadmium chloride vapor may be about 400 to about 900 degrees Celsius.

The ovens 200 shown in the embodiments of FIGS. 2 and 3 are maintained at an appropriate temperature for heat treatment of the applied cadmium chloride layer. Thus, the heat treatment occurs simultaneously with the deposition of the cadmium chloride layer. In one embodiment, the oven 200 may be operated at a temperature of about 350 to about 600 degrees Celsius. In another embodiment, the oven 200 may be operated at a temperature of about 385 to about 500 degrees Celsius. In another embodiment, the oven 200 may be operated at a temperature of about 400 to about 450 degrees Celsius. The oven 200 may be a controlled ambient oven, in which load/exit locks or gas curtains are used to control internal oxygen levels to keep oxygen out and cadmium chloride in. Optionally, forming gas could be used in the oven 200 to control oxygen at very low levels.

Using a combined vapor cadmium chloride deposition and heat treatment process, as described in the embodiments, provides several advantages over the previously known methods. As discussed above, the method of the disclosed embodiments combines application of the cadmium chloride layer and heat treatment into a single continuous process step. Further, the embodiments provide improved control over the cadmium chloride deposition and the heat treatment parameters. Direct control over the amount of moisture in the oven may be achieved. The cadmium chloride amount is independently controlled from the substrate temperature, and very small amounts of cadmium chloride can be injected when the substrate is at the optimal annealing temperature. The vaporization of high amounts of cadmium chloride can lead to condensation and, hence, a dry cadmium chloride deposition on the substrate, which will perform an anneal in a subsequent thermal bake. Additionally, the conventional stations used specifically to form the cadmium chloride layer in a first step may be eliminated from a processing line.

Figure 4:
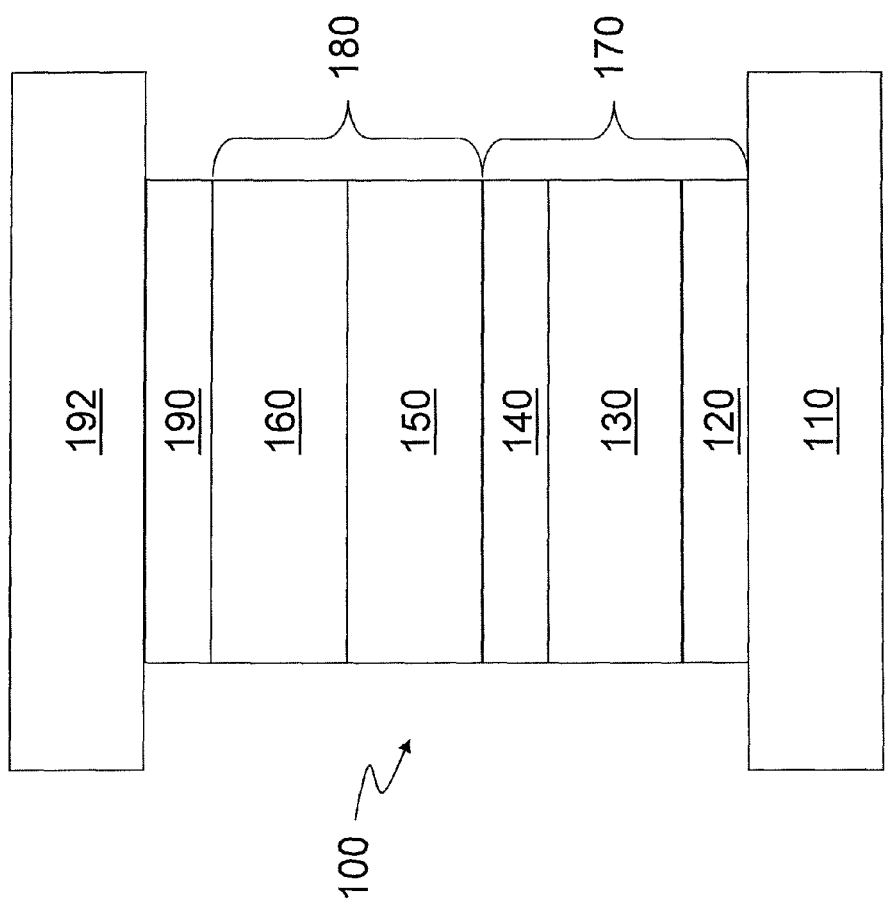
FIG. 4 is a schematic of a photovoltaic device having multiple layers.

Following the cadmium chloride treatment, a back contact metal 190 may be deposited onto the cadmium telluride layer 160, as shown in FIG. 4. A back support 192 may be deposited onto the back contact metal 190. The back support 192 may include any suitable material, including a glass, for example, a soda-lime glass.

Photovoltaic devices/modules fabricated using the methods discussed herein may be incorporated into one or more photovoltaic arrays. The arrays may be incorporated into various systems for generating electricity. For example, a photovoltaic module may be illuminated with a beam of light to generate a photocurrent. The photocurrent may be collected and converted from direct current (DC) to alternating current (AC) and distributed to a power grid. Light of any suitable wavelength may be directed at the module to produce the photocurrent, including, for example, more than 400 nm, or less than 700 nm (e.g., ultraviolet light). Photocurrent generated from one photovoltaic module may be combined with photocurrent generated from other photovoltaic modules. For example, the photovoltaic modules may be part of a photovoltaic array, from which the aggregate current may be harnessed and distributed.

The embodiments described above are offered by way of illustration and example. It should be understood that the examples provided above may be altered in certain respects and still remain within the scope of the claims. It should be appreciated that, while the invention has been described with reference to the above preferred embodiments, other embodiments are within the scope of the claims.

What is claimed as new and desired to be protected by Letters Patent of the United States is:

1. A method of treating a cadmium telluride layer, the method comprising:
    forming a cadmium chloride vapor from powdered cadmium chloride in a vaporization unit;
    moving a substrate containing a cadmium telluride layer through a controlled ambient deposition oven;
    continuously depositing the cadmium chloride vapor from the vaporization unit on the cadmium telluride layer in the controlled ambient oven as the substrate moves through the oven; and
    heat treating the cadmium telluride layer at a temperature to heat treat and crystallize the cadmium telluride layer, wherein the steps of depositing the cadmium chloride vapor and heat treating the cadmium telluride layer occur simultaneously to provide a continuous single step of cadmium chloride deposition and heat treatment of the cadmium telluride layer, the continuous single step deposition of the cadmium chloride and heat treating the cadmium telluride layer occurring in the oven; and forming a back contact metal on the single step cadmium chloride deposited and heat treated cadmium telluride layer.

2. The method of claim 1, further comprising transporting the substrate through the oven at the same time as depositing the cadmium chloride and heat treating the cadmium telluride layer.

3. The method of claim 1, further comprising vaporizing the cadmium chloride powder in the vaporizer unit at a vaporizing temperature that is higher than a temperature at which the cadmium telluride layer is heat treated.

4. The method of claim 3, wherein the temperature at which the cadmium telluride layer is heat treated is about 385 to about 500 degrees Celsius.

5. The method of claim 3, wherein the temperature at which the cadmium telluride layer is heat treated is about 400 to about 450 degrees Celsius.

6. The method of claim 1, further comprising depositing the cadmium chloride vapor on the cadmium telluride layer using a diffuser.

7. The method of claim 6, further comprising using a carrier gas to distribute the vaporized cadmium chloride.

8. An apparatus for manufacturing a photovoltaic module, comprising:
- a controlled ambient oven comprising a heater for heating the interior of the oven, the oven having associated structures to control internal oxygen levels within the oven;
- a vaporization unit arranged outside the oven for vaporizing powdered cadmium chloride;
- a conveyor for continuously moving a substrate containing a cadmium telluride layer through the oven;
- a diffuser arranged inside the oven for continuously diffusing vaporized cadmium chloride from the vaporization unit within the oven onto the cadmium telluride material as the substrate moves though the oven, wherein the vaporization unit and heater operate to deposit the cadmium chloride on the cadmium telluride material and simultaneously heat treat the cadmium chloride coated cadmium telluride material to heat treat the coated cadmium telluride material to increase grain size and to thereby provide a continuous single step deposition of the cadmium chloride and heat treatment of the cadmium telluride material.

9. The apparatus of claim 8, further comprising a transport mechanism arranged inside the oven for transporting a substrate through the oven.

10. The apparatus of claim 9, wherein the transport mechanism comprises a belt or a plurality of rollers.

11. The apparatus of claim 8, wherein the temperature of the vaporization unit and the temperature of the heater are controlled separately.

12. The apparatus of claim 8, wherein the oven comprises loading/exit locks or gas curtains to control internal oxygen levels of the oven.

13. An apparatus for manufacturing a photovoltaic module, comprising:
- a controlled ambient oven comprising a heater for heat treating a cadmium telluride layer arranged on a substrate;
- a vaporization unit for vaporizing powdered cadmium chloride;
- a conveyor for continuously moving the substrate and cadmium telluride layer through the oven;
- a diffuser arranged inside the oven for continuously diffusing vaporized cadmium chloride from the vaporization unit within the oven and depositing cadmium chloride vapor into the cadmium telluride layer as the substrate moves through the oven, wherein depositing the cadmium chloride occurs within the oven at the same time as heat treating the cadmium telluride layer to provide a continuous single step deposition of the cadmium chloride and heat treatment of the cadmium telluride layer within the oven,
- wherein the vaporization unit is an ex-situ vaporization unit arranged outside the oven.

* * * * *